(12) United States Patent
Mielke

(10) Patent No.: US 12,172,491 B2
(45) Date of Patent: Dec. 24, 2024

(54) THERMOELECTRIC COOLING AND HEATING SYSTEM FOR NON-IDLING VEHICLE

(71) Applicant: PACCAR Inc, Bellevue, WA (US)

(72) Inventor: David Mielke, Denton, TX (US)

(73) Assignee: PACCAR Inc, Bellevue, WA (US)

(*) Notice: Subject to any disclaimer, the term of this patent is extended or adjusted under 35 U.S.C. 154(b) by 0 days.

(21) Appl. No.: 17/497,036

(22) Filed: Oct. 8, 2021

(65) Prior Publication Data

US 2023/0113329 A1    Apr. 13, 2023

(51) Int. Cl.
 *B60H 1/00* (2006.01)
 *B60H 1/22* (2006.01)
 *H01L 23/38* (2006.01)

(52) U.S. Cl.
 CPC ..... *B60H 1/00478* (2013.01); *B60H 1/00378* (2013.01); *B60H 1/004* (2013.01);
 (Continued)

(58) Field of Classification Search
 CPC ............ B60H 1/00478; B60H 1/00378; B60H 1/004; B60H 1/00428; B60H 1/00807;
 (Continued)

(56) References Cited

U.S. PATENT DOCUMENTS 5,547,019 A * 8/1996 Iacullo ................ F02B 29/0456
                                                            62/3.61
5,623,828 A * 4/1997 Harrington ........ B60H 1/00264
                                                            62/412
(Continued)

FOREIGN PATENT DOCUMENTS

DE  102012112300 A1 * 3/2014 .......... B60H 1/2225
DE  102013206923 A1 * 6/2014 .............. B60H 1/00
(Continued)

OTHER PUBLICATIONS

PCT International Searching Authority; International Search Report and Written Opinion for Application No. PCT/US2022/077859, mailed Jan. 31, 2023; 13 pages.
(Continued)

*Primary Examiner* — Ljiljana V. Ciric
(74) *Attorney, Agent, or Firm* — Merchant & Gould P.C.

(57) ABSTRACT

Systems and methods are provided for cooling and heating in a vehicle. A thermoelectric cooling system can include a heatsink in thermal communication with an exterior of a vehicle, thermoelectric cells within the vehicle mounted to the heatsink, and a power supply electrically connected to the one or more thermoelectric cells. In response to receiving power from the power supply, the thermoelectric cells produce a temperature difference to draw heat from the vehicle in to the heatsink. Cooling a vehicle cabin can include receiving a desired temperature and a current temperature of a vehicle cabin, determining a temperature difference between the desired temperature and the current temperature, and, based on determining the temperature difference indicates the desired temperature is lower than the current temperature, causing thermoelectric cells to receive power so the thermoelectric cells produce a temperature difference to draw heat from the vehicle cabin in to the heatsink.

20 Claims, 9 Drawing Sheets

(52) U.S. Cl.
CPC ..... B60H 1/00428 (2013.01); B60H 1/00807 (2013.01); B60H 1/2218 (2013.01); B60H 1/2225 (2013.01); *B60H 1/00778* (2013.01); *B60H 2001/224* (2013.01); *B60H 2001/2262* (2013.01); *B60H 2001/2265* (2013.01); *H01L 23/38* (2013.01)

(58) Field of Classification Search
CPC ................ B60H 1/2218; B60H 1/2225; B60H 2001/224; B60H 2001/2262; B60H 2001/2265; H01L 23/38
See application file for complete search history.

(56) References Cited

U.S. PATENT DOCUMENTS

| | | | | |
|---|---|---|---|---|
| 5,646,455 | A * | 7/1997 | Price | B60H 1/00642 219/202 |
| RE38,128 | E * | 6/2003 | Gallup | B60H 1/00285 62/3.61 |
| 6,662,572 | B1 * | 12/2003 | Howard | B60H 1/00264 62/235.1 |
| 6,763,666 | B2 * | 7/2004 | Fong | B60N 3/104 62/3.61 |
| 7,059,137 | B2 * | 6/2006 | Childress | B60H 1/00264 62/3.61 |
| 7,073,338 | B2 * | 7/2006 | Harwood | F25B 21/02 62/3.61 |
| 7,533,535 | B2 * | 5/2009 | Kadle | B60H 1/00478 62/3.61 |
| 7,610,767 | B2 * | 11/2009 | Kadle | B60N 2/5628 62/3.61 |
| 7,779,639 | B2 * | 8/2010 | Goenka | F25B 21/04 165/41 |
| 7,832,214 | B2 * | 11/2010 | Ito | B60N 2/5692 62/3.61 |
| 7,870,892 | B2 * | 1/2011 | Gawthrop | B60H 1/00007 62/3.61 |
| 8,176,741 | B2 * | 5/2012 | Kameyama | B60N 2/5685 62/3.61 |
| 8,316,650 | B2 * | 11/2012 | Yang | B60H 1/00428 62/3.61 |
| 8,418,477 | B2 * | 4/2013 | Klein | B60H 1/00778 62/235.1 |
| 8,516,842 | B2 * | 8/2013 | Petrovski | B60N 2/5635 62/3.61 |
| 8,613,200 | B2 * | 12/2013 | LaGrandeur | B60H 1/00478 165/41 |
| 8,631,659 | B2 * | 1/2014 | Goenka | F25B 21/04 62/3.61 |
| 8,839,633 | B2 * | 9/2014 | Quisenberry | B60H 1/00478 62/3.61 |
| 8,966,913 | B2 * | 3/2015 | Oh | B60H 1/00478 62/3.61 |
| 9,016,071 | B2 * | 4/2015 | Oh | B60H 1/00478 62/3.61 |
| 9,842,978 | B1 * | 12/2017 | Salvador | F01P 7/16 |
| 2005/0178128 | A1 * | 8/2005 | Harwood | B60H 1/00478 62/3.61 |
| 2006/0130490 | A1 * | 6/2006 | Petrovski | B60N 2/5642 62/3.61 |
| 2006/0174633 | A1 * | 8/2006 | Beckley | F25B 21/04 62/3.61 |
| 2008/0028768 | A1 * | 2/2008 | Goenka | B60H 1/00478 62/3.61 |
| 2008/0047277 | A1 * | 2/2008 | Kim | B60H 1/00428 62/235.1 |
| 2008/0168787 | A1 * | 7/2008 | Kameyama | B60N 2/5692 62/244 |
| 2009/0000311 | A1 * | 1/2009 | Kmetz | B60H 1/00478 62/3.61 |
| 2009/0199572 | A1 * | 8/2009 | Klein | B60H 1/00428 62/235.1 |
| 2010/0050659 | A1 * | 3/2010 | Quisenberry | B60H 1/00478 62/3.61 |
| 2010/0132380 | A1 | 6/2010 | Robinson | |
| 2010/0294455 | A1 * | 11/2010 | Yang | B60H 1/00428 62/235.1 |
| 2010/0313576 | A1 * | 12/2010 | Goenka | F25B 21/04 62/3.61 |
| 2011/0079023 | A1 * | 4/2011 | Goenka | B60H 1/00492 62/3.61 |
| 2011/0107772 | A1 * | 5/2011 | Goenka | B60H 1/00478 62/3.61 |
| 2011/0107773 | A1 * | 5/2011 | Gawthrop | B60H 1/00007 62/3.61 |
| 2012/0079837 | A1 * | 4/2012 | Maranville | B60N 2/5692 62/3.61 |
| 2012/0102973 | A1 * | 5/2012 | Oh | B60H 1/00028 62/3.61 |
| 2012/0102974 | A1 * | 5/2012 | Kawazoe | F28D 1/0417 62/3.61 |
| 2012/0222429 | A1 * | 9/2012 | Ban | B60H 1/00478 62/3.61 |
| 2013/0000325 | A1 * | 1/2013 | Asai | B60L 50/51 62/3.61 |
| 2013/0333395 | A1 * | 12/2013 | Morita | B60H 1/00478 62/3.61 |
| 2014/0069112 | A1 * | 3/2014 | Park | B60N 3/104 62/3.61 |
| 2014/0090829 | A1 * | 4/2014 | Petrovski | B60N 2/5635 62/3.61 |
| 2014/0130519 | A1 * | 5/2014 | De Pelsemaeker | F25B 21/02 62/3.61 |
| 2014/0305625 | A1 * | 10/2014 | Petrovski | B60N 2/5635 62/3.61 |
| 2015/0101353 | A1 * | 4/2015 | Oh | B60H 1/00478 62/3.2 |
| 2015/0101355 | A1 * | 4/2015 | Oh | H01M 10/6572 62/3.2 |
| 2015/0121902 | A1 * | 5/2015 | Steinman | B60H 1/245 62/3.61 |
| 2015/0298524 | A1 * | 10/2015 | Goenka | B60H 1/32 62/3.61 |
| 2015/0375597 | A1 * | 12/2015 | Callahan | B60H 1/00264 62/3.61 |
| 2016/0361968 | A1 * | 12/2016 | Bell | B60H 1/00278 |
| 2017/0259643 | A1 * | 9/2017 | Ranalli | B60H 1/00478 |
| 2023/0113329 | A1 * | 4/2023 | Mielke | B60H 1/00478 62/3.61 |

FOREIGN PATENT DOCUMENTS

| | | | | |
|---|---|---|---|---|
| EP | 1598223 | A2 * | 11/2005 | ......... B60H 1/00285 |
| EP | 2495118 | A2 * | 9/2012 | ......... B60H 1/00478 |
| FR | 2973311 | A1 * | 10/2012 | ......... B60H 1/00478 |
| KR | 20140098435 | A | 8/2014 | |
| KR | 101558663 | B1 * | 10/2015 | |
| KR | 20200102093 | A | 8/2020 | |

OTHER PUBLICATIONS

Business Wire, "New Peterbilt SmartAir System Makes Smart Business Sense", 2012 Mid-America Trucking Show, located online at: https://www.businesswire.com/news/home/20120321005567/en/New-Peterbilt-SmartAir-System-Makes-Smart-Business-Sense, Mar. 21, 2012, 2 pages.

Hebei I.T. (Shangha) Co. Ltd, data sheet for Thermoelectric Cooler, Tec1-12730, Rev. 2.03, located online at: https://peltiermodules.com/peltier.datasheet/TEC1-12730.pdf, 5 pages.

* cited by examiner

THERMOELECTRIC COOLING AND HEATING SYSTEM FOR NON-IDLING VEHICLE

BACKGROUND

Vehicle operators, such as operators of semi-trailer trucks, may occupy the cabin of a vehicle while the engine is turned off. For example, a semi-trailer truck operator may sleep in a vehicle cabin overnight with the engine turned off to prevent fuel waste, reduce emissions, and to comply with anti-idling policies. When the engine is turned off, any power consuming device the vehicle operator wishes to use, such as a heating and cooling system, must operate using power supplied from a battery. The battery supplying the power is typically part of the vehicle's electrical system, and operates in a typical range of 12-24 volts. Such a battery can be recharged when the engine is turned on or by connection to an external charger (e.g., if the vehicle is an electric or plug-in hybrid vehicle).

It is desirable that a vehicle operator does not drain a vehicle battery entirely when using power consuming devices while the vehicle engine is not in operation. Additionally, when a vehicle operator occupies the vehicle while the engine is turned off, the vehicle operator may wish to only cool or heat a specific area in the vehicle (e.g., a sleeper area where the vehicle operator might be located within a vehicle cabin during such times when the vehicle is not in operation).

A traditional heating, ventilation, and cooling (HVAC) system used for temperature control within an entire vehicle cabin may consume a significant amount of power, may be too large to install multiple HVAC systems to heat or cool a specific area, and may have intricate and/or expensive parts. For that reason, smaller-size, special purpose heating/cooling systems have been developed. Even in circumstances where such smaller-size heating/cooling systems have been implemented, it is often the case that significant power consumption is required. In such cases, either a significant battery draw is required, or an auxiliary power unit (APUS) would be used to satisfy the power requirements of such systems. APUs consume gas and provide an auxiliary power source that may supply power to such smaller-scale heating/cooling systems, and add significant complexity to vehicle systems.

It is with respect to these and other general considerations that the aspects disclosed herein have been made. Also, although relatively specific problems may be discussed, it should be understood that the examples should not be limited to solving the specific problems identified in the background or elsewhere in this disclosure.

SUMMARY

Examples of the present disclosure relate to systems and methods for providing cooling and heating in a vehicle. For example, the systems and methods may cool and/or heat a vehicle cabin while the vehicle's engine is not idling or otherwise in operation. In another example, the systems and methods may cool and/or heat a vehicle cabin without consuming excessive power stored by a vehicle battery.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Additional aspects, features, and/or advantages of examples will be set forth in part in the description which follows and, in part, will be apparent from the description, or may be learned by practice of the disclosure.

In one aspect, a thermoelectric cooling system for a vehicle cabin is provided. The thermoelectric cooling system includes: a heatsink in thermal communication with an exterior of a vehicle cabin; one or more thermoelectric cells positioned within the vehicle cabin, each of the one or more thermoelectric cells having a first side and a second side, the second side mounted to the heatsink; and a power supply electrically connected to the one or more thermoelectric cells. In response to receiving power from the power supply, the one or more thermoelectric cells are operable to produce a temperature difference between the first side and the second side, thereby drawing heat from the vehicle cabin to the heatsink.

In another aspect, a method for cooling a vehicle cabin is provided. The method includes: receiving an indication of a desired temperature of the vehicle cabin; determining a current temperature of the vehicle cabin; determining a temperature difference between the desired temperature and the current temperature; and based on a determination that the temperature difference indicates the desired temperature is lower than the current temperature: causing one or more thermoelectric cells to receive power from a power supply, wherein the thermoelectric cells have a first side and a second side, the second side mounted to a heatsink in thermal communication with an exterior of a vehicle cabin; and in response to response to receiving power, the one or more thermoelectric cells are operable to produce a temperature difference between the first side and the second side, thereby drawing heat from the vehicle cabin to the heatsink.

In a further aspect, a vehicle is provided that includes: a vehicle cabin; a power supply; and a thermoelectric cooling system. The thermoelectric cooling system includes: a heatsink in thermal communication with an exterior of the vehicle cabin; one or more thermoelectric cells positioned within the vehicle cabin, each of the one or more thermoelectric cells having a first side and a second side, the second side mounted to the heatsink; and a power supply electrically connected to the one or more thermoelectric cells. In response to receiving power from the power supply, the one or more thermoelectric cells are operable to produce a temperature difference between the first side and the second side, thereby drawing heat from the vehicle cabin to the heatsink.

BRIEF DESCRIPTION OF THE DRAWINGS

Non-limiting and non-exhaustive examples are described with reference to the following figures.

DETAILED DESCRIPTION

Figure 1:
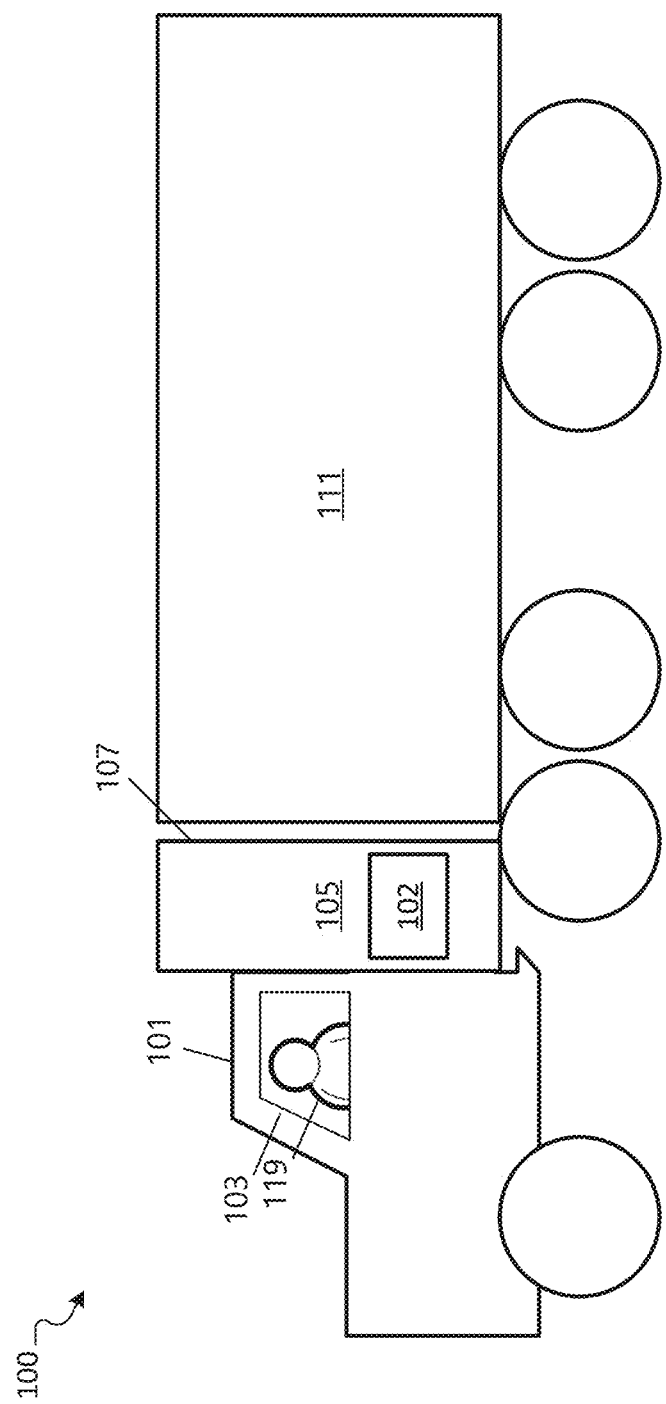
FIG. 1 is a schematic example of a vehicle in which a thermoelectric cooling system may be implemented.

In the following detailed description, references are made to the accompanying drawings that form a part hereof, and in which are shown by way of illustrations specific embodiments or examples. These aspects may be combined, other aspects may be utilized, and structural changes may be made without departing from the present disclosure. Embodiments may be practiced as methods, systems, or devices. The following detailed description is therefore not to be taken in a limiting sense, and the scope of the present disclosure is defined by the appended claims and their equivalents.

An environment, such as a vehicle environment, may need a cooling and/or heating system that is sized to be placed in areas of the environment to provide directed cooling, have parts that can be maintained inexpensively, and produce cooling power and/or heating power efficiently to make the environment suitable and/or comfortable for occupation. A thermoelectric cooling system with these features reduces power demands for such a heating/cooling system, and provides for a system that may be operable from a vehicle battery for an extended period of time while not being charged by an external source of power and/or an operating engine. For example, a vehicle may be parked overnight, and the engine cannot be idled for reasons including anti-idling rules, conservation of fuel, and/or environmental concerns. In another example, an electric vehicle cannot effectively utilize electrical systems, including heating/cooling systems, that drain the electrical power supply, since such draining could prevent the vehicle from restarting engine operation.

An example thermoelectric cooling system includes one or more thermoelectric cells and a heatsink. The thermoelectric cells and the heatsink are not intricate parts and can replaced inexpensively. Additionally, the size thermoelectric cooling system can be limited since the only required parts are the thermoelectric cells and the heatsink. In examples, the thermoelectric cells are 62 millimeters long and 62 millimeters wide. Additionally, the thermoelectric cells can produce cooling power while consuming less energy than a traditional HVAC system. In examples, the thermoelectric cooling system produces the same cooling power as a traditional HVAC system while consuming half of the power otherwise required, or less.

Due to the reduced size requirements of such a thermoelectric cooling system, the thermoelectric cooling system described herein can be positioned in an environment to directly cool a desired cooling area such as bunk for sleeping, a seating area, and/or a driver's seat. Also, multiple thermoelectric cooling systems can be placed in an environment to directly cool different desired cooling areas and/or the entire environment. In some examples, fans can be positioned near the one or more thermoelectric cooling systems to spread the air the thermoelectric cooling system produces. In other examples, the thermoelectric cooling system may be positioned to ensure that convection results in effective air circulation for the desired cooling area(s).

In some examples, a thermoelectric cooling system cools air when the thermoelectric cells are provided power. The thermoelectric cells have a first side and a second side, and the thermoelectric cells produce a temperature difference when the thermoelectric cells receive power. For example, the temperature difference causes the first side to lower in temperature and the second side to raise in temperature. In examples, the second side of the thermoelectric cell is mounted or otherwise connected to heatsink, and the first side may be exposed to an environment to be cooled. The heatsink may be positioned, or exposed, exterior to the environment, and the heatsink absorbs or otherwise draws the heat from the thermoelectric cell to the exterior of the vehicle cabin, thereby cooling the environment. The lower temperature produced on the first side may produce condensation from the process of cooling the air in the environment. In examples, a fan can be used to disperse the condensation produced and/or a drip tray can be positioned near or attached to the thermoelectric cooling system to collect the condensation.

In examples, the thermoelectric cells of the thermoelectric cooling system are positioned at the bottom of the thermoelectric cooling system. The positioning of the thermoelectric cells allows the cold air produced by the air contacting the first side having the lower temperature to sink due to the density of the colder air. Therefore, the thermoelectric cooling system can directly cool a cooling area directly below the thermoelectric cooling system, and can induce air circulation in such a location. In an example, one or more fans can be positioned below the thermoelectric cooling system to extend the cooling area and/or cool additional areas of the environment.

While the thermoelectric cooling system is referred to as a cooling system herein, the thermoelectric cooling system can be positioned and oriented to heat a selected, environment, as will be described in more detail herein.

In some examples, the thermoelectric cooling system may operate by determining or receiving the desired temperature in an environment and determining or receiving the current temperature in the environment. The thermoelectric cooling system should operate when the desired temperature is lower than the current temperature. For example, if a desired temperature is 70° F. and the current temperature of 74° F., the thermoelectric cooling system should operate to cool the environment and bring the current temperature to 70° F. The thermoelectric cooling system would not, in such circumstances, operate when the desired temperature is higher than the current temperature. In some examples, the thermoelectric cooling system should not operate when the desired temperature is equal to the current temperature, but the cooling power of the thermoelectric cooling system may also be controlled to operate to keep the current temperature at the desired temperature. The cooling power of the thermoelectric system can also be controlled when the desired temperature and the current temperature are close together to prevent the current temperature from dropping below the desired temperature.

In an example, the cooling power of the thermoelectric cooling system can be controlled by determining the magnitude of the difference between the desired temperature and current temperature and determining a voltage to supply to the thermoelectric cooling system. In an example, a temperature difference between a desired temperature of 70° F. and a current temperature of 74° is four degrees. A variation of voltage can be a voltage level ranging from no volts to a maximum voltage rating of the thermoelectric cells of the thermoelectric cooling system. For example, the maximum voltage of a thermoelectric cell can be twelve volts, so the variation of the voltage can be any voltage between zero and twelve volts. In examples, the relationship between the temperature difference produced and the voltage supplied is positive. In examples, the positive relationship is a linear relationship. For example, supplying six volts to a thermoelectric cell that has a maximum voltage of twelve volts will result in the thermoelectric cell producing a temperature difference that is half of the maximum temperature difference of thermoelectric cell. Therefore, the cooling power of the thermoelectric cell increases as the voltage supplied increases.

In another example, the cooling power of the thermoelectric cooling system can be controlled by determining the magnitude of the difference between the desired temperature and current temperature and determining a fraction of a period to supply power to the thermoelectric cells of the thermoelectric cooling system based on the magnitude. The period can be any length of time that allows the cooling power of the thermoelectric cooling system to be controlled. Additionally, the period can repeat so the thermoelectric cooling system cycles between states of being supplied voltage and being supplied no voltage. For example, the period may be two seconds, and the fraction can be determined to be half of the period. In this example, the thermoelectric cooling system will receive voltage for one second, receive no voltage for the next second, and so on as long as the period repeats. The cooling capability (i.e., the rate or extent of cooling) of the thermoelectric cooling system can be controlled by adjusting the time during which voltage is applied.

In examples, a control unit controls the thermoelectric cooling system and the power supply that supplies power to the thermoelectric cooling system, such as by the methods of controlling the cooling power of the thermoelectric cooling system described above. The control unit may limit or prevent the power supply from providing power to the thermoelectric cooling system based on the charge of the power supply. The control unit can also control any fans that are used.

Overall, the thermoelectric cooling system provides for a cooling (or heating) system that may be selected for use in an appropriate location and magnitude for use within a vehicle. The thermoelectric cooling system has, in certain aspects, fewer intricate parts that are prone to failure, and uses less power than a traditional HVAC heating/cooling system, thereby reducing energy consumption. Such an arrangement may allow the vehicle operator to use the cooling and heating system for a longer period, and make the vehicle cabin suitable to be occupied by improving the comfort of occupying the cabin without the operator needing to idle the vehicle's engine.

I. Vehicle Environment

With reference now to FIG. 1, an example vehicle environment 100 is illustrated within which aspects of the present disclosure can be implemented. For example, FIG. 1 includes a side view of the vehicle 101 further including a schematic view of various components that may be included in the vehicle 101 that may be used as an environment for a thermoelectric cooling system, according to example embodiments described herein. In some examples, the vehicle 101 may be a heavy-duty truck such as a part of a tractor-trailer combination. The vehicle 101 may have what is sometimes referred to as, a fifth wheel by which a box-like, flat-bed, or tanker semi-trailer 111 (among other examples) may be attached for transporting cargo or the like. While the vehicle 101 is depicted as a truck in FIG. 1, it should be appreciated that the present technology is applicable to any type of vehicle where implementation of a thermoelectric cooling system may be desired.

As shown, the example vehicle 101 includes a cab area 103, as well as a sleeper area 105. The cab area 103 may be a location within the vehicle 101 in which a vehicle operator 119 may operate the vehicle, and the sleeper area 105 may correspond to a separate area within the vehicle 101 where the vehicle operator 119 may rest when the vehicle 101 is not in operation. In example embodiments, the sleeper area 105 may include a separate thermoelectric cooling system 102 useable to cool an interior of the sleeper area 105 when the vehicle 101 is not in operation.

As will be described in further detail below, in various examples, the thermoelectric cooling system 102 may be configured as a thermoelectric cooling system that utilizes thermoelectric plates. Such thermoelectric plates create a temperature differential between opposite sides of such plates when a voltage is applied. In example embodiments, the thermoelectric cooling system 102 may be specifically positioned to conduct heat out from a rear side 107 of sleeper area 105, for example into an area outside of the vehicle 101 (e.g., between the sleeper area 105 and the semi-trailer 111). Example installations of such a thermoelectric cooling system 102 are described in further detail below with reference to FIGS. 2-10.

Figure 2:
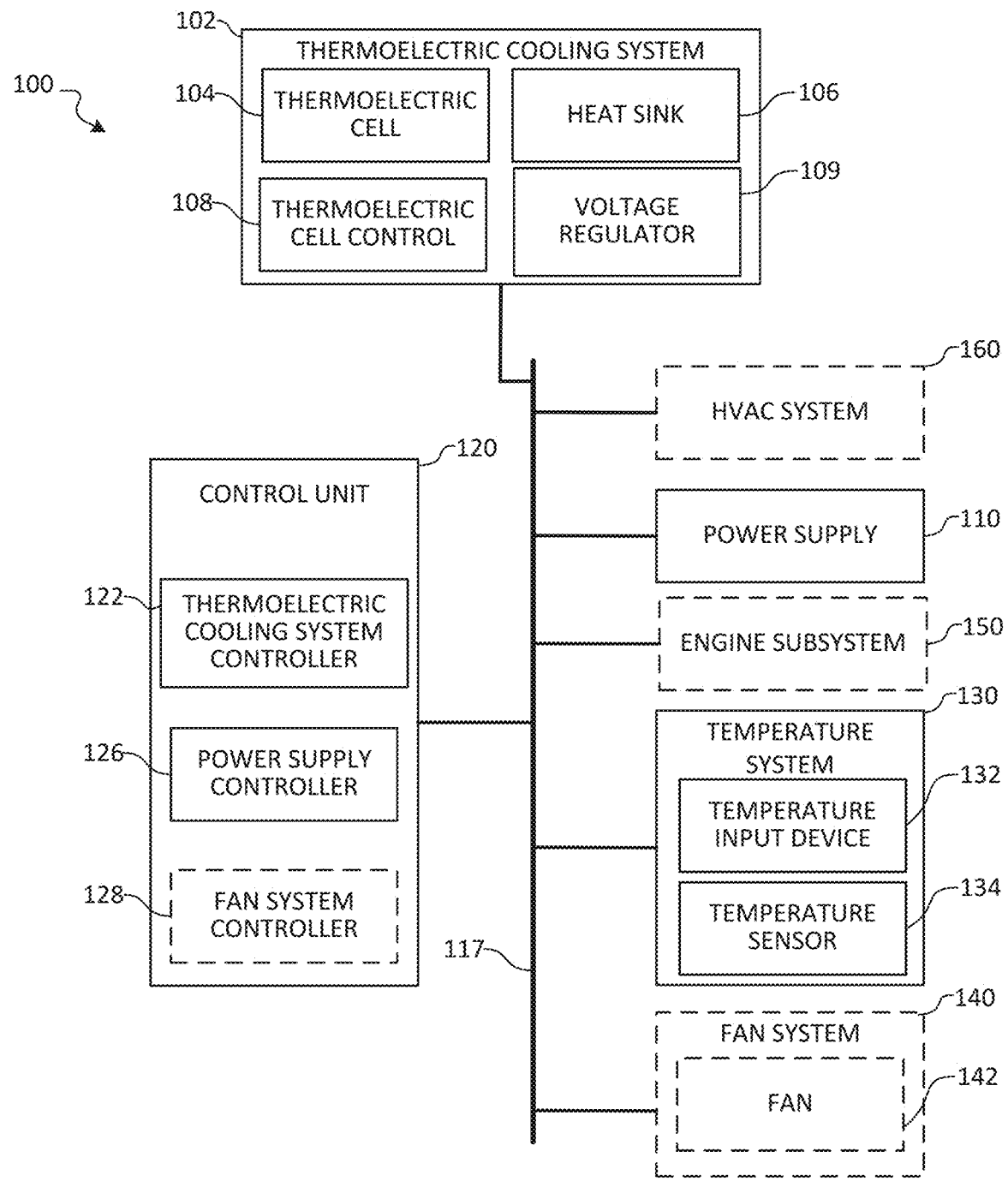
FIG. 2 is a block diagram illustrating an example vehicle environment including a thermoelectric cooling system.

FIG. 2 is a block diagram illustrating functional components of the example vehicle environment 100 including a thermoelectric cooling system 102. In this example, the vehicle environment 100 includes the thermoelectric cooling system 102, as well as a power supply 110, a control unit 120, a temperature system 130, and, optionally, a fan system 140, an engine 150, and an HVAC system 160.

In the example shown, the thermoelectric cooling system 102 includes a thermoelectric cell 104 and a heatsink 106. In example embodiments, the thermoelectric cell 104 is generally planar or flat, and has a first side and a second side opposite the first side. When voltage is applied to such a thermoelectric cell 104, a temperature difference is formed across the opposite sides, with a first side being a cooled side and a second side being a heated side. While the example thermoelectric cooling system 102 is illustrated as including a single thermoelectric cell 104, the thermoelectric cooling system 102 may include any number of thermoelectric cells 104. Adding thermoelectric cells 104 increases the cooling power of the thermoelectric cooling system 102 because each additional cell will produce a temperature difference when the thermoelectric cooling system 102 is supplied power.

In the example shown, the thermoelectric cooling system 102 further includes a thermoelectric cell control circuit 108 and a voltage regulator 109. The thermoelectric cell control circuit 108 can, in example embodiments, control the extent of voltage delivered to one or more of the thermoelectric cells 104, for example controlling a duty cycle or voltage level a voltage applied to such cells. The voltage regulator 109 may convert a voltage on a power and communication bus 117 to an appropriate voltage that may be received by the one or more thermoelectric cells 104.

The power supply 110 is implemented as an electrical power supply configured to deliver power to electrical components within the vehicle 101, for example via the power and communication bus 117. The power supply 110 may therefore supply power to each of the thermoelectric cooling system 102, control unit 120, temperature system 130, fan system 140, and HVAC system 160. In example embodiments, the power supply 110 can be configured as a battery supply that is rechargeable via engine 150 (e.g., in the case of an internal combustion or hybrid vehicle), or via an external connector (e.g., in the case of a battery-electric vehicle). The power supply 110 may be a primary power supply of the vehicle 101 or a secondary power supply that is specifically configured to delivery power for use by the thermoelectric cooling system 102.

The example control unit 120 can include one or more programmable circuits and or analog control circuitry usable to control one or more vehicle subsystems. In the example shown, the control unit 120 may provide control signals to the thermoelectric cooling system 102, the temperature system 130, as well as the optional HVAC system 160 and fan system 140 to control operation thereof. In an example embodiment, the control unit 120 includes a thermoelectric cooling system controller 122, a power supply controller 126, and, optionally, a fan system controller 128. The thermoelectric cooling system controller 122 generally provides control of the thermoelectric cooling system 102, for example by controlling operation of one or more thermoelectric cell control circuits 108.

In example embodiments, the control unit 120, and optionally one or more other controllers described herein, may be implemented as a processing unit, such as a central processing unit (CPU) or other hardware controller. A CPU typically includes one or more components, such as one or more microprocessors, for performing the arithmetic and/or logical operations required for program execution, and storage media, such as one or more memory cards (e.g., flash memory) for program and data storage, and a random access memory, for temporary data and program instruction storage. From a software standpoint, a CPU typically includes software resident on a storage media (e.g., a memory card), which, when executed, directs the CPU in performing transmission and reception functions. The CPU software may run on an operating system stored on the storage media, such as, for example, UNIX or Windows, iOS, Linux, and the like, and can adhere to various protocols such as the Ethernet, ATM, TCP/IP protocols and/or other connection or connectionless protocols. As is well known in the art, CPUs can run different operating systems, and can contain different types of software, each type devoted to a different function, such as handling and managing data/information from a particular source or transforming data/information from one format into another format. It should thus be clear that the embodiments described herein are not to be construed as being limited for use with any particular type of server computer, and that any other suitable type of device for facilitating the exchange and storage of information may be employed instead.

A CPU may be a single CPU, or may include plural separate CPUs, wherein each is dedicated to a separate application, such as, for example, a data application, a voice application, and a video application. Software embodiments of the example embodiments presented herein may be provided as a computer program product, or software, that may include an article of manufacture on a machine accessible or non-transitory computer-readable medium (i.e., also referred to as "machine readable medium") having instructions. The instructions on the machine accessible or machine readable medium may be used to program a computer system or other electronic device. The machine-readable medium may include, but is not limited to, optical disks, CD-ROMs, and magneto-optical disks or other type of media/machine-readable medium suitable for storing or transmitting electronic instructions. The techniques described herein are not limited to any particular software configuration. They may find applicability in any computing or processing environment. The terms "machine accessible medium", "machine readable medium" and "computer-readable medium" used herein shall include any non-transitory medium that is capable of storing, encoding, or transmitting a sequence of instructions for execution by the machine (e.g., a CPU or other type of processing device) and that cause the machine to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

The example temperature system 130 includes a temperature input device 132 and a temperature sensor 134. The optional fan system 140 includes a fan 142, but the fan system 140 may include any number of fans, or may be excluded entirely. The components of the vehicle environment 100 can be inside a vehicle cabin of a vehicle, an engine compartment, outside the vehicle, and/or at another location in the vehicle. Example positions of the various components will be described in further detail herein with respect to FIGS. 7-10.

In example embodiments, the temperature system 130 may be a system specific to the thermoelectric cooling system 102, or may be integrated into an overall vehicle temperature control system for the vehicle 101. For example, the temperature system 130 may be usable to set either an overall vehicle interior temperature or a vehicle temperature for one or more regions within the vehicle interior. In some embodiments, when the vehicle is in operation (e.g., when an engine is running) the temperature system 130 may control a temperature of the overall vehicle interior, while when the vehicle is not in operation (e.g., when the engine is not running) the temperature system 130 may be selectable to control only a sub-region within the vehicle (e.g., a sleeper area 105 and within the vehicle 101).

In operation, the vehicle environment 100 can be cooled via the operation of the thermoelectric cooling system 102. The thermoelectric cooling system 102 and/or the thermoelectric cell 104 receives power from the power supply 110 to cool the vehicle environment 100, such as a vehicle cabin of the vehicle environment 100. In response to receiving power from the power supply 110, the thermoelectric cell 104 produces a temperature difference between the first side and the second side. For example, the produced temperature difference causes the first side to lower in temperature and the second side to raise in temperature. In examples, the second side of the thermoelectric cell is mounted or otherwise connected to the heatsink 106. The heatsink 106 may be positioned such that it is exposed to an exterior to the vehicle cabin of the vehicle environment 100. The heatsink 106 absorbs or otherwise draws the heat from the thermoelectric cell 104 to the exterior of the vehicle cabin, thereby cooling the interior of the vehicle cabin. In some examples, the thermoelectric cooling system 102 can be positioned in a way that the thermoelectric cooling system 102 can be used to heat the vehicle environment.

The control unit 120 can control the power supplied to the thermoelectric cooling system 102 via the thermoelectric cooling system controller 122 and/or the power supply controller 126. The control unit 120, via the thermoelectric cooling system controller 122 for example, can cause the power supply 110 to send or cease sending power to the thermoelectric cooling system 102 via the power supply controller 126, or via control signals sent to the thermoelectric cell control circuit 108. Additionally, the control unit 120 can, in cooperation with the thermoelectric cell control circuit 108 and voltage regulator 109 restrict the amount of power the power supply 110 supplies. For example, if the charge of the power supply 110 is at a level that indicates the power supply 110 will discharge below a desired amount, the control unit 120 can prevent components of the vehicle environment 100 from receiving power from the power supply 110 and/or limit the power the components of the vehicle environment 100 can receive. For example, the desired amount may be the charge level of the power supply 110 that enables the power supply 110 to turn the engine 150 on to operate. In an example with an electric vehicle, the desired amount may be the charge level of the power supply 110 that allows the vehicle of the vehicle environment 100 to be powered by the power supply 110 and travel a distance, such as fifty miles.

The control unit 120 determines the desired temperature of the vehicle environment 100 by receiving an input via the temperature input device 132 of the temperature system 130. The temperature input device 132 can be operated by a user to input the desired temperature of the vehicle environment 100. The control unit 120 determines the current temperature in the vehicle environment 100 by receiving the current temperature determined by the temperature sensor 134 of the temperature system 130. The control unit 120 determines the difference between the desired temperature and the current temperature to determine how to control the power supplied to the thermoelectric cooling system 102. For example, if the desired temperature is lower than the current temperature, the thermoelectric cooling system controller 122 will cause the power supply 110 to provide power to the thermoelectric cooling system 102, such as via the power supply controller 126. In another example, if the desired temperature is higher than the current temperature, the thermoelectric cooling system controller 122 will not cause the power supply 110 to begin providing power or will cause the power supply 110 to stop providing power to the thermoelectric cooling system 102, such as via the power supply controller 126.

The thermoelectric cooling system controller 122 can also vary the amount of power sent to the thermoelectric cooling system 102 via control signals sent to the voltage regulator 109 (either directly or via the thermoelectric cell control circuit 108), thereby altering the temperature difference produced by the thermoelectric cell 104. For example, the thermoelectric cell 104 may be able to receive a maximum of 12 volts, a measure of electric potential, and produce the maximum temperature difference possible when receiving 12 volts. Power is a product of electric current and voltage, so the power can be varied to vary the voltage.

A variation of the power supplied to the thermoelectric cell 104 by the power supply 110 can be determined by the voltage regulator 109 and caused by the power supply controller 126 to supply the variation of the power supplied, such as 12 volts or less, to the thermoelectric cell 104. In examples, the voltage received by the thermoelectric cell 104 and the temperature difference produced by the thermoelectric cell 104 has a linear relationship. For example, if the thermoelectric cell 104 is supplied 3 volts, a quarter of the maximum voltage possible, the thermoelectric cell will produce a quarter of its maximum temperature difference. When the thermoelectric cell 104 is supplied 6 volts, half of the maximum voltage possible, the thermoelectric cell will produce half of its maximum temperature difference. When the thermoelectric cell 104 is supplied 9 volts, three quarters of the maximum voltage possible, the thermoelectric cell will produce three quarters of its maximum temperature difference, and so on. To determine the amount of power that should be sent to supply the desired voltage, the control unit 120 of the thermoelectric cooling system controller 122 can determine a magnitude of the difference between the desired temperature and the current temperature. For example, the magnitude of the difference between a desired temperature of 72° F. and a current temperature of 78° F. is 5. If the magnitude indicates that the difference between the desired temperature and the current temperature is large, the thermoelectric cooling system controller 122 may determine that the thermoelectric cell 104 should receive power sufficient to receive 12 volts, and therefore produce the maximum temperature difference possible. For example, the magnitude of 5 described above may be determined to be large enough to send power sufficient to receive 12 volts. In another example, the magnitude may be 1, indicating that the current temperature has almost matched the desired temperature. In this example, the thermoelectric cooling system controller 122 may determine to supply power that is that provides a voltage lower than the maximum voltage to the thermoelectric cell 104. The thermoelectric cooling system controller 122 may cause the power supply 110 to supply less power to the thermoelectric cell 104 via power supply controller 126 to produce a temperature difference lower than the maximum temperature difference of the thermoelectric cell 104 to ensure that the current temperature does not go below the desired temperature.

Additionally, the control unit 120 can reduce the temperature difference the thermoelectric cell 104 produces by alternating supplying power and not supplying power in a period. In example, the period with the determined fraction of power being supplied can be repeated until a desired temperature is reached. For example, the control unit 120 may determine that the thermoelectric cell 104 should produce a temperature difference equivalent to half of the maximum temperature difference the thermoelectric cell 104 can produce. The thermoelectric cooling system controller 122 can cause the power supply 110 to supply power to the thermoelectric cell 104 for half of the period via the voltage regulator 124 and/or the power supply controller 126. In an example, the period is one second, so power is supplied to the thermoelectric cell 104 for half of a second during the period. The period may continue indefinitely until a desired temperature is reached, so the thermoelectric cell 104 will alternated between receiving power for half of a second and receiving no power for half of a second. In this example, the relationship between the produced temperature difference and the fraction of the period that power is supplied is linear, but the relationship may vary.

The control unit 120, via the power supply controller 126 for example, can also cause the power supply 110 to supply power to other components of the vehicle environment 100 including the temperature system 130, the optional fan system 140, the optional engine 150, and the optional HVAC system 160. In example alternative embodiments, the control unit 120 can cause the power supply controller 126 to supply power to these other components of the vehicle environment, while controlling the power supply 110, via the thermoelectric cell control circuit 108 and/or voltage regulator 109, to supply a lower or higher voltage to the thermoelectric cell(s) 104.

In example embodiments, the temperature system 130 can also determine a scheduled time when cooling should occur. For example, the temperature system 130 can receive a desired temperature and a time to start cooling to the desired temperature. The temperature system 130 can set the scheduled time to the received time to start cooling. In an example, the temperature system 130 sends the desired temperature to the control unit 120 at the scheduled time, causing the thermoelectric cooling system controller 122 to initiate cooling by supplying power to the thermoelectric cooling system 102 at the scheduled time. In other examples, the temperature system 130 sends the desired temperature and the scheduled time to the control unit 120 when it is received via the temperature input device 132. Therefore, the control unit 120 can cause the thermoelectric cooling system controller 122 to initiate cooling by supplying power to the thermoelectric cooling system 102 at the scheduled time.

The optional fan system 140 is a system that controls an optional fan 142. While only a single fan 142 is illustrated, the vehicle environment can include multiple fans arranged in the vehicle environment. In examples the fan 142 is located near the thermoelectric cooling system 102 to spread the cooler air caused by the operation of thermoelectric cooling system 102 around the vehicle environment, such as in the vehicle cabin. The optional fan system controller 128 can cause the fan 142 to operate.

The optional engine 150 is the engine of the vehicle environment 100. In example implementations, the engine corresponds to an internal combustion engine. In some instances, due to local regulations, the engine 150 may not be operating during some periods in which the thermoelectric cooling system 102 is in use. In examples, the engine 150 recharges the power supply 110 when the engine 150 is operating. In some examples, the vehicle environment 100 is the environment of an electric vehicle, and the vehicle environment 100 does not have an engine. In such examples, the power supply 110 may be recharge by an external charging connection that is electrically connected to the power and communication bus 117.

In examples, the optional HVAC system 160 is a heating, cooling, and ventilation system in the vehicle environment 100. The HVAC system 160 may consume more power to cool and/or heat the vehicle than the thermoelectric cooling system 102, be larger than the thermoelectric cooling system 102 such that only a single HVAC system 160 can be included, and/or include intricate and/or expensive parts that increase repair costs. For example, the HVAC system may require a refrigerant cycle to run that requires multiple parts to cool and/or heat an environment. An example refrigerant cycle includes compressing vapor, sending the compressed vapor to a condenser to transfer heat, expanding the vapor, and sending the expanded vapor to an evaporator to transfer heat to the vapor in a continuous cycle. The HVAC system may additionally only operate when the optional engine 150 is operating.

II. Thermoelectric Cooling System Methods

Figure 3:
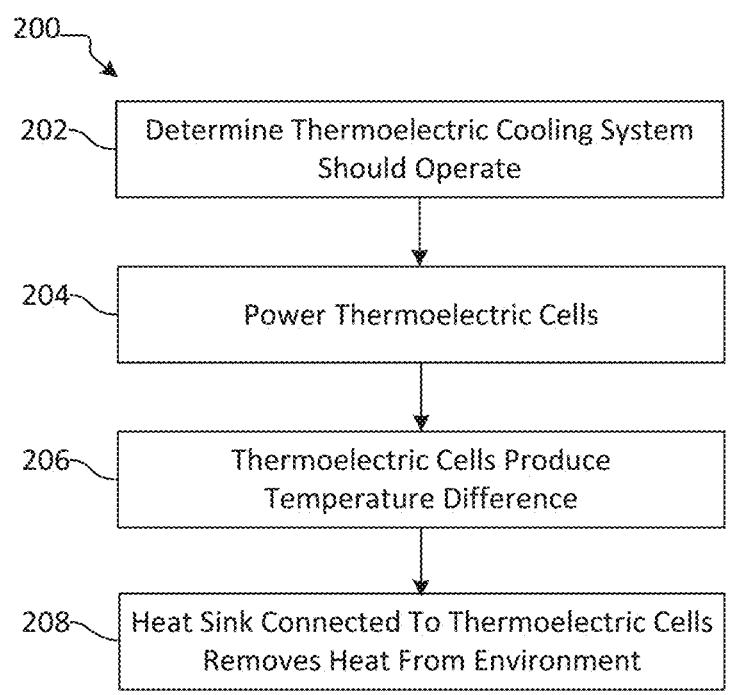
FIG. 3 is a flow chart illustrating an example method of cooling an environment using thermoelectric cells.
Figure 4:
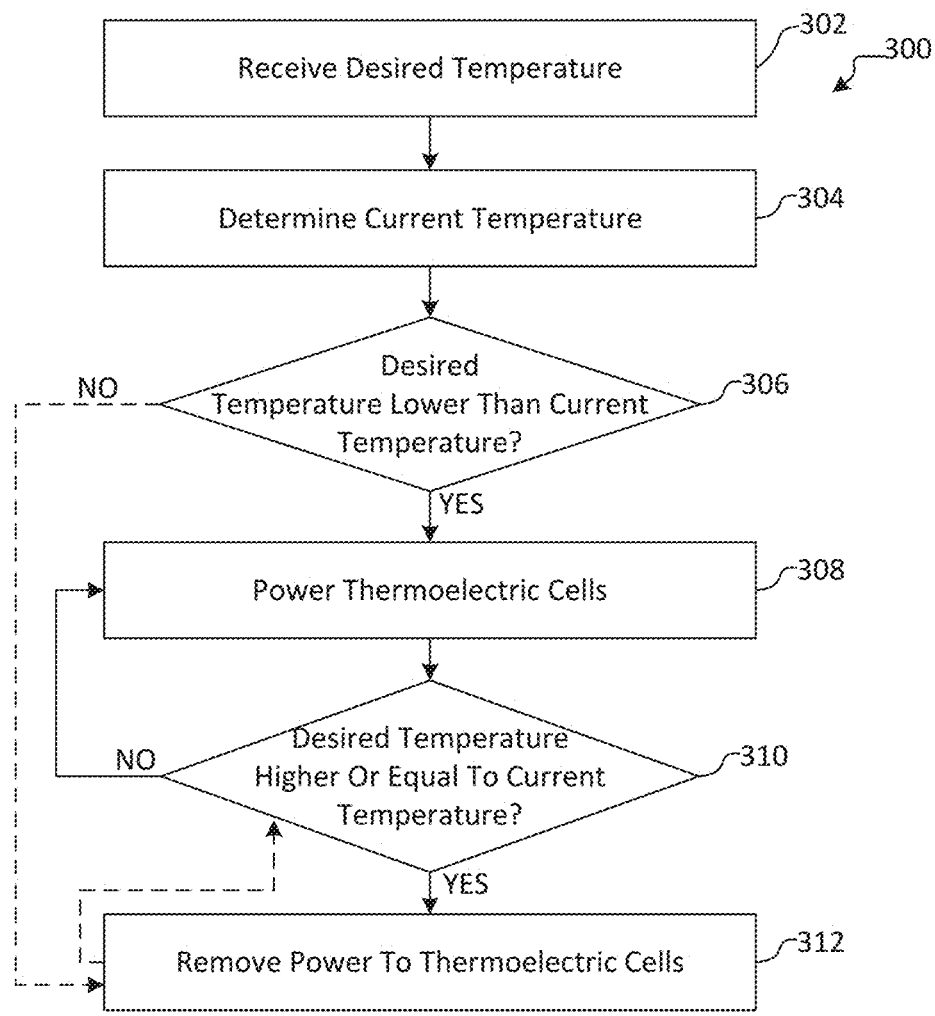
FIG. 4 is a flow chart illustrating an example method of cooling an environment using thermoelectric cells.
Figure 5:
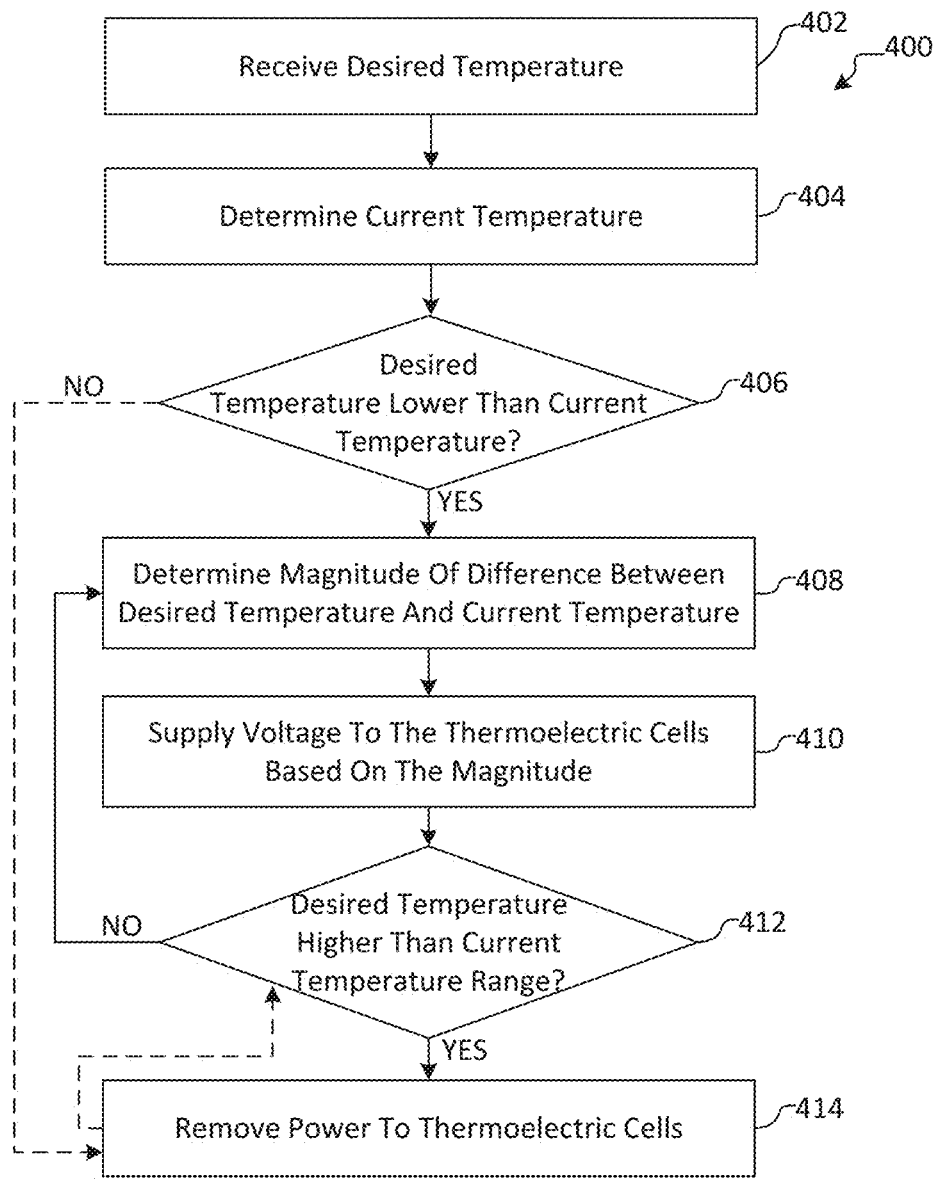
FIG. 5 is a flow chart illustrating an example method of cooling an environment using thermoelectric cells.

Referring to FIGS. 3-5, example methods of operation of a thermoelectric cooling system are described with reference to the vehicle 101 described above in conjunction with FIGS. 1-2. FIG. 3 is a flowchart illustrating an example method 200 of cooling an environment using thermoelectric cells, such as the vehicle 101 or a portion thereof (e.g., including sleeper area 105). At operation 202, it is determined that a thermoelectric cooling system should operate. For example, the control unit 120 may receive a request to supply power to the thermoelectric cooling system 102 to lower the temperature in an environment such as a vehicle cabin. In examples, the control unit 120 may determine the thermoelectric cooling system 102 should operate because the current temperature determined by the temperature sensor 134 is higher than the desired temperature received by the control unit 120 via temperature input device 132. In another example, the control unit 120 may receive an input to operate the thermoelectric cooling system 102 via thermoelectric cooling system controller 122.

Once it is determined that the thermoelectric cooling system should operate, thermoelectric cells of the thermoelectric cooling system are supplied power at operation 204. For example, the power supply 110 supplies power to the thermoelectric cell 104, e.g., via the thermoelectric cell control circuit 108 and/or voltage regulator 109.

At operation 206, the thermoelectric cells produce a temperature difference in response to receiving power at operation 204. For example, the thermoelectric cell 104 produces a temperature difference across its opposed sides while it is supplied power. In examples, the produced temperature difference causes the temperature of the first side to lower in temperature and the second side to raise in temperature.

At operation 208, a heatsink connected to the thermoelectric cells removes heat from the environment. The heatsink may be positioned adjacent to, or partially or wholly exposed to an exterior of the vehicle, such that the heatsink may remove the heat from the interior of the vehicle. For example, the heatsink 106 is connected to the second side of the thermoelectric cell 104, absorbs the heat produced by the temperature difference, and removes the heats from the environment, such as by dissipating heat at an exterior to a vehicle cabin.

FIG. 4 is a flow chart illustrating an example method 300 of cooling an environment using thermoelectric cells. At operation 302, a desired temperature is received. The desired temperature is a desired temperature to be produced or the desired temperature for an environment to reach. For example, the control unit 120 receives the desired temperature received by the temperature input device 132.

At operation 304, the current temperature is determined. The current temperature is the current temperature of the environment. For example, the control unit 120 receives the current temperature determined by the temperature sensor 134.

Flow proceeds to operation 306, and it is determined whether the desired temperature is lower than the current temperature. For example, the control unit 120 and/or the thermoelectric cooling system controller 122 determines whether the desired temperature is lower than the current temperature. If it is determined that the desired temperature is not lower than the current temperature, method 300 may end or may optionally proceed to operation 312. Because the desired temperature is lower than the current temperature, method 300 ends because the environment does not need to be cooled. Method 300 may end if the thermoelectric cooling system controller 122 determines that power is not being supplied to the thermoelectric cells. Alternatively, flow may proceed to operation 312, and the power to the thermoelectric cells will be removed.

If it is determined that the desired temperature is lower than the current temperature, flow proceeds to operation 308. Thermoelectric cells are supplied power at operation 308. For example, the power supply 110 supplies power to the thermoelectric cell 104. In response to receiving power the thermoelectric cells produce a temperature difference. For example, the thermoelectric cell 104 produces a temperature difference while it is supplied power. The thermoelectric cell 104 has a first side and a second side. In examples, the produced temperature difference causes the temperature of the first side to lower in temperature and the second side to raise in temperature. A heatsink, such as the heatsink 106, is connected to the second side of the thermoelectric cell 104, absorbs the heat produced by the temperature difference, and removes the heats from the environment, such as exterior to a vehicle cabin. Therefore, the temperature in the environment is lowered when the thermoelectric cells receive power.

Flow proceeds to operation 310, and it is determined whether the desired temperature is higher or equal to the current temperature. For example, the control unit 120 and/or the thermoelectric cooling system controller 122 determines whether the desired temperature is higher or equal to the current temperature. If it is determined that the desired temperature is not higher or equal to the current temperature, flow proceeds back to operation 308 and the thermoelectric cells continue to receive power.

If it is determined that the desired temperature is higher or equal to the current temperature, flow proceeds to operation 312. At operation 312, power is removed from the thermoelectric cells. For example, the power supply controller 126 causes the power supply 110 to stop supplying power to the thermoelectric cell 104. Method 300 can optionally return to operation 306 to continue to check whether the desired temperature is equal to or higher than the current temperature. The thermoelectric cells can then receive power again if the desired temperature becomes lower than the current temperature.

FIG. 5 is a flow chart illustrating an example method 400 of cooling an environment using thermoelectric cells. At operation 402, a desired temperature is received. For example, the control unit 120 receives the desired temperature received by the temperature input device 132.

The desired temperature is determined at operation 404. For example, the control unit 120 receives the current temperature determined by the temperature sensor 134.

Flow proceeds to operation 406, and it is determined whether the desired temperature is lower than the current temperature. For example, the thermoelectric cooling system controller 122 determines whether the desired temperature is lower than the current temperature. If it is determined that the desired temperature is not lower than the current temperature, method 400 may end or may optionally proceed to operation 414. Because the desired temperature is lower than the current temperature, the environment does not need to be cooled. Method 400 may end if the thermoelectric cooling system controller 122 determines that power is not being supplied to the thermoelectric cells. Alternatively, flow may proceed to operation 414, and the power to the thermoelectric cells will be removed.

If it is determined that the desired temperature is lower than the current temperature, flow proceeds to operation 408. At operation 408, the magnitude of the temperature difference between the desired temperature and the current temperature is determined. For example, the thermoelectric cooling system controller 122 determines the magnitude of the temperature difference between the desired temperature and the current temperature.

Thermoelectric cells are supplied power based on the magnitude at operation 410. For example, the power supply 110 supplies power to the thermoelectric cell 104 based on the magnitude. The voltage regulator 124 may regulate the power supplied to vary the voltage the thermoelectric cell receives. In response to receiving power the thermoelectric cells produce a temperature difference that has a linear relationship with the voltage received. For example, the thermoelectric cell 104 produces a temperature difference equal to half the maximum temperature difference of the thermoelectric cell 104 while it is supplied power that causes the thermoelectric cell to receive a voltage that half of the maximum rated voltage of the thermoelectric cell 104. In examples, the produced temperature difference causes the temperature of the first side to lower in temperature and the second side to raise in temperature. A heatsink, such as the heatsink 106, is connected to the second side of the thermoelectric cell 104, absorbs the heat produced by the temperature difference, and removes the heats from the environment, such as exterior to a vehicle cabin. Therefore, the temperature in the environment is lowered when the thermoelectric cells receive power. And the larger the temperature difference produced by the thermoelectric cells, the faster the temperature in the environment is lowered due to more heat being removed.

Flow proceeds to operation 412, and it is determined whether the desired temperature is higher or equal to the current temperature. For example, the thermoelectric cooling system controller 122 determines whether the desired temperature is higher or equal to the current temperature. If it is determined that the desired temperature is not higher or equal to the current temperature, flow proceeds back to operation 408.

If it is determined that the desired temperature is higher or equal to the current temperature, flow proceeds to operation 414. At operation 414, power is removed from the thermoelectric cells. For example, the power supply controller 126 causes the power supply 110 to stop supplying power to the thermoelectric cell 104. Method 400 can optionally return to operation 406 to continue to check whether the desired temperature is equal to or higher than the current temperature. The thermoelectric cells can then receive power again if the desired temperature becomes lower than the current temperature.

Figure 6:
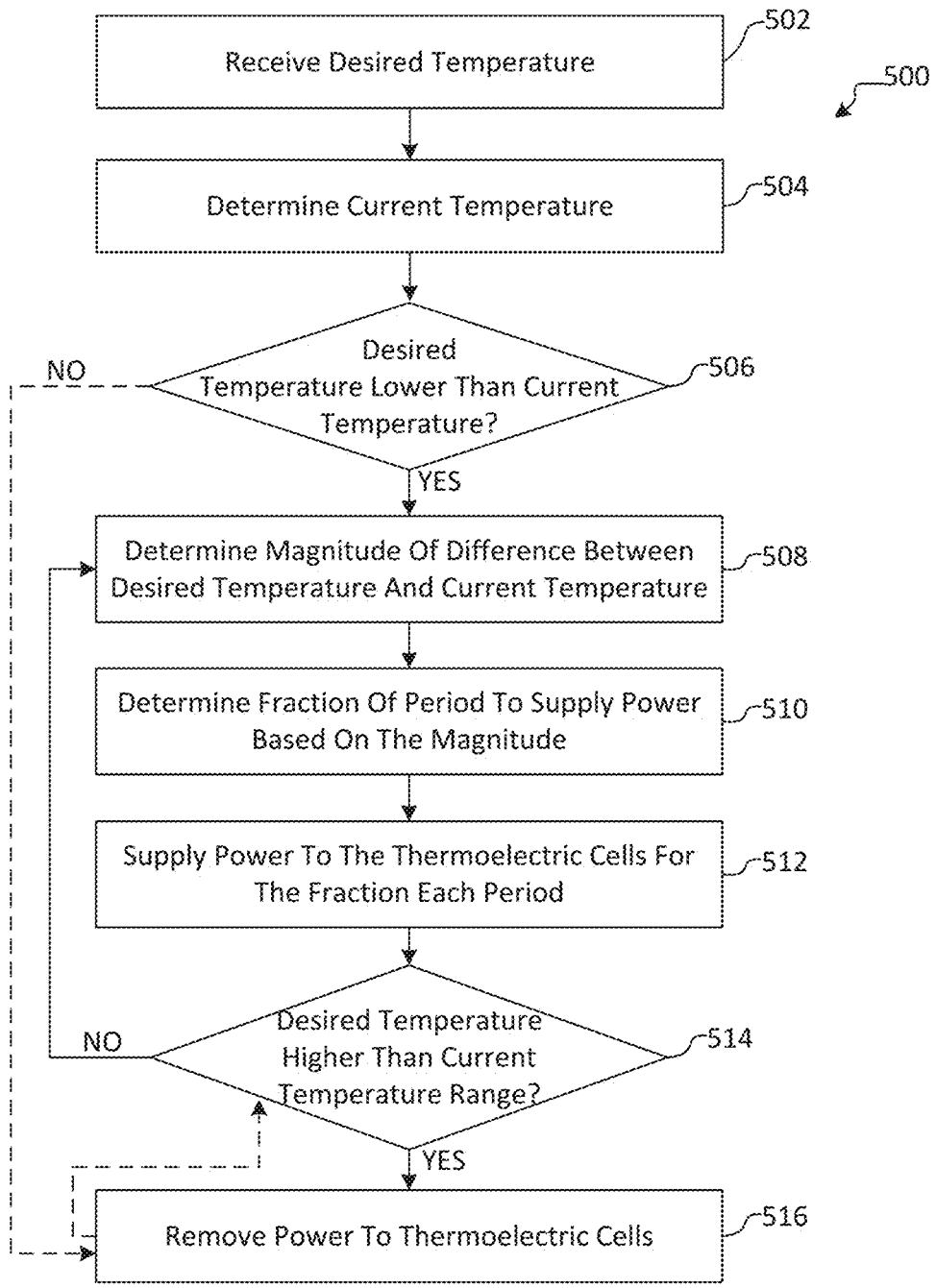
FIG. 6 is a flow chart illustrating an example method of cooling an environment using thermoelectric cells.

FIG. 6 is a flow chart illustrating an example method of cooling an environment using thermoelectric cells. Beginning at operation 502, a desired temperature is received. For example, the thermoelectric cooling system controller 122 receives the desired temperature received by the temperature input device 132.

The desired temperature is determined at operation 504. For example, the thermoelectric cooling system controller 122 receives the current temperature determined by the temperature sensor 134.

Flow proceeds to operation 506, and it is determined whether the desired temperature is lower than the current temperature. For example, the thermoelectric cooling system controller 122 determines whether the desired temperature is lower than the current temperature. If it is determined that the desired temperature is not lower than the current temperature, method 500 may end or may optionally proceed to operation 516. Because the desired temperature is lower than the current temperature, the environment does not need to be cooled. Method 500 may end if the thermoelectric cooling system controller 122 determines that power is not being supplied to the thermoelectric cells. Alternatively, flow may proceed to operation 516, and the power to the thermoelectric cells will be removed.

If it is determined that the desired temperature is lower than the current temperature, flow proceeds to operation 508. At operation 508, the magnitude of the temperature difference between the desired temperature and the current temperature is determined. For example, the thermoelectric cooling system controller 122 determines the magnitude of the temperature difference between the desired temperature and the current temperature.

At operation 510, a period and a fraction of the period to supply power to the thermoelectric cells is determined. For example, the thermoelectric cooling system controller 122 determines a period and a fraction of the period that the power supply 110 should supply power to the thermoelectric cell 104. The period is a length of time that may repeats continuously, such as one second. The thermoelectric cooling system controller 122 can determine a period that is appropriate to supply power to the thermoelectric cell to provide effective operation. The fraction of the period can be any percentage of the period from one percent to one hundred percent of the period. The environment will experience more cooling as the percentage of the fraction of the period that power is supplied is increased. Therefore, the thermoelectric cooling system controller 122 determines a larger fraction when more cooling is needed, indicated by a larger magnitude, and a smaller fraction when less cooling is needed, indicated by a smaller magnitude. For example, the thermoelectric cooling system controller 122 may determine that the fraction should be one fourth of the period of one second. The voltage regulator 124 and/or the power supply controller 126 would cause the power supply 110 to supply power to the thermoelectric cell 104 for a quarter second each second in this example. The period can repeat as many times as the thermoelectric cooling system controller 122 determines. In an example, the thermoelectric cooling system controller 122 may determine a fraction of the period that will hold the current temperature at the desired temperature indefinitely when power is supplied for the fraction of the period.

Thermoelectric cells are supplied power for the fraction of the period at operation 512. For example, the power supply 110 supplies power to the thermoelectric cell 104 for the fraction of the period. The power supply controller 126 may regulate the power supplied to cause the power supply 110 to supply power only during the fraction of the period. If the fraction of the period is larger, such as three quarters of the period, the thermoelectric cell 104 is supplied power for a longer amount of time, three quarters of the period, and produces a larger temperature difference than when the fraction of the period is shorter, such as one quarter, and the thermoelectric cell 104 is powered for one quarter of the period.

Flow proceeds to operation 514, and it is determined whether the desired temperature is higher or equal to the current temperature. For example, the thermoelectric cooling system controller 122 determines whether the desired temperature is higher or equal to the current temperature. If it is determined that the desired temperature is not higher or equal to the current temperature, flow proceeds back to operation 508.

If it is determined that the desired temperature is higher or equal to the current temperature, flow proceeds to operation 516. In operation 516, power is removed from the thermoelectric cells. For example, the power supply controller 126 causes the power supply 110 to stop supplying power to the thermoelectric cell 104. Method 500 can optionally return to operation 506 to continue to check whether the desired temperature is equal to or higher than the current temperature. The thermoelectric cells can then receive power again if the desired temperature becomes lower than the current temperature.

III. Thermoelectric Cooling System Installations

Figure 7:
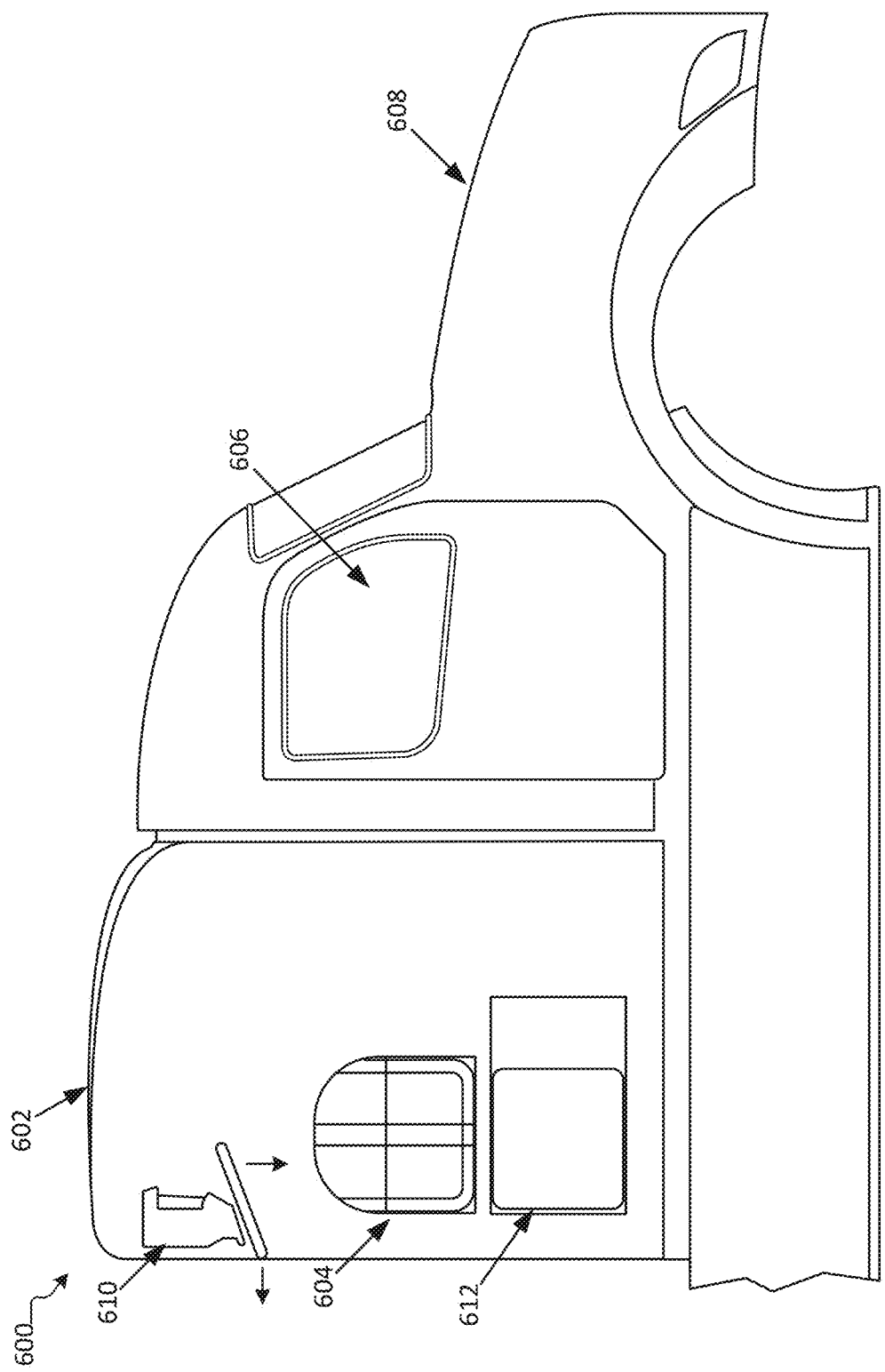
FIG. 7 is an example vehicle environment in which a thermoelectric cooling system may be implemented.

FIG. 7 is a detailed example of a vehicle environment 600, which represents a possible version of the vehicle 101 described above in conjunction with FIGS. 1-2. Vehicle environment 600 illustrates an example configuration of a portion of a thermoelectric cooling system 102 in a vehicle cabin. The example vehicle environment 600 includes a vehicle cabin 602 that includes a sleeper area, also referred to as a rear cabin 604, as well as a front cabin 606. In the example shown, the vehicle environment 600 further includes engine compartment 608.

The rear cabin 604 can include a bunk area for sleeping, a restroom, a seating area, and other features that a vehicle operator desires. The front cabin 606 includes a driving area such as a driver seat, passenger seat and driving controls. The engine compartment 608 can include an engine, such as engine 150, and a power supply, such as power supply 110. The power supply can be located in a different area of the vehicle environment, however.

In the example shown, the rear cabin 604 has a shelving unit 610 mounted above an area to be cooled by a thermoelectric cooling system. For example, the shelving unit 610 may be mounted above a platform 612, for example which may support a bed or other rest area. In this example, the rear cabin 604 is the area intended to be cooled during a time when an engine is not in operation. Accordingly, one or more thermal electric cells may be mounted above the platform 612, for example to an underside of the shelving unit 610.

The position of the thermoelectric cooling cells allows the cooling produced by the thermoelectric cooling system to directly cool the rear cabin 604 because the cells are located directly above the platform 612. While at least a portion of the rear cabin 604 positioned below the thermoelectric cells is cooled directly, the thermoelectric cells may cool additional parts of the vehicle cabin 602. For example, the thermoelectric cooling system may be supplied power to produce the maximum temperature difference, and therefore the most cooling possible, to cool the entire rear cabin 604, or the entire vehicle cabin 602.

Figure 9:
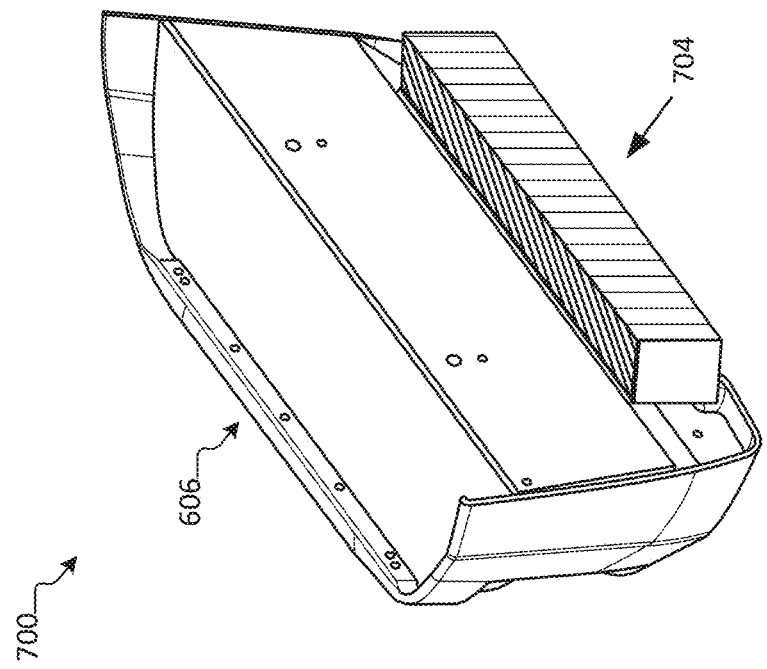
FIG. 9 is a rear side illustration of the portion of a thermoelectric cooling system of FIG. 8.
Figure 8:
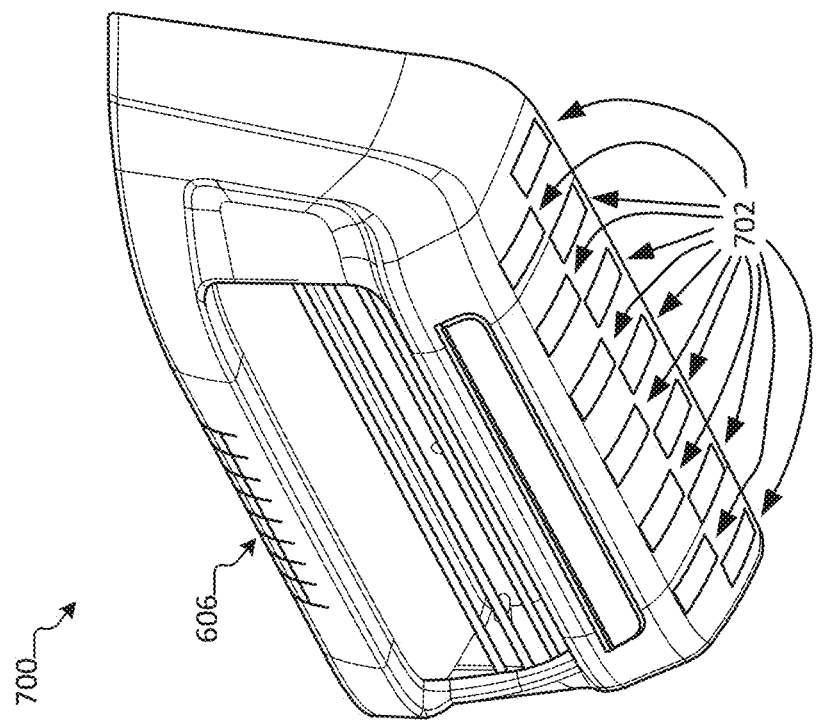
FIG. 8 is a front side illustration of a portion of a thermoelectric cooling system mounted on a shelving unit, according to an example embodiment.

Now referring to FIGS. 8-9, a portion 700 of a thermoelectric cooling system is shown, including a plurality of thermoelectric cells 702 mounted to an underside of the overhead shelving unit 610. In this example, the portion 700 of the thermoelectric cooling system includes twelve thermoelectric cells 702. While twelve thermoelectric cells 702 are included in this example, any number of thermoelectric cells 702 may be included. In examples, the portion 700 of a thermoelectric cooling system may be used as a portion of the thermoelectric cooling system 102 illustrated in FIGS. 1-2 (e.g., as thermoelectric cells 104). It is noted that where twelve such cells are used, a cooling effect if 7,250 BTU per hour may be achieved at a total power of 253 watts. Such an arrangement provides equivalent cooling to existing systems at less than half (and nearly one quarter) of the power typically consumed by such cooling systems. Of course, the amount of power consumed, and the cooling effect achieved, may be varied according to the number of thermoelectric cells 702 that are utilized.

The thermoelectric cells 702 are attached to the overhead shelving unit 610. The thermoelectric cells 702 each have a first side and a second side, and a temperature difference is created between the first side and the second side when power is supplied to the thermoelectric cells 702. Typically, the second side, which increases in temperature when a temperature difference is produced, is attached to a thermally conductive mounting location, which is in turn attached to a heatsink 704. In optional embodiments, the thermoelectric cells 702 are directly attached to the heatsink 704, such that a heated side of each thermoelectric cell 702 is in thermal communication with the heatsink 704, with a cooled side of each thermoelectric cell 702 (the side shown as exposed in FIG. 8) being exposed within the rear cabin 604.

The heatsink 704 is thermally attached to each thermoelectric cell 702. The heatsink 704 draws heat produced by the thermoelectric cells 702, and transfers the heat to an exterior of the environment to be cooled (i.e., an exterior of the rear cabin 604). For example, the heatsink 704 may be positioned or exposed exterior to the vehicle cabin to transfer heat to the exterior of the vehicle cabin. In examples, the heatsink 704 may extend between the rear cabin 604 and the exterior environment, thereby allowing thermoelectric cells 702 to be mounted directly, or in close proximity, to the heatsink 704.

Because the thermoelectric cells 702 are attached to an overhead shelving unit 610, and positioned above a bed or other sleeping location within the rear cabin 604, the arrangement as shown allows the cooled air, which naturally sinks due to the higher density of the colder air, produced by the lower temperature of the first side when power is supplied to the thermoelectric cells 702 to sink below the shelving unit 610. Therefore, the thermoelectric cells 702 can be positioned in an environment to target cooling directly below their location and efficiently provide cooling due to convection effects.

Although in the example shown the thermoelectric cells are positioned on an underside of an overhead shelving unit 610, it is recognized that such thermoelectric cells may be positioned in other locations throughout the rear cabin 604 or front cabin 606. Therefore, multiple targeted areas of the environment can have thermoelectric cooling systems 102 that receive cooling directly from one of the thermoelectric cooling systems 102.

In some examples the thermoelectric cells 702 can be positioned to heat the environment. For example, the thermoelectric cells 702 can be mounted to a heatsink 704 in an opposite orientation, such that a heated side is exposed within the vehicle cabin 602 and a cooled side is affixed or in thermal communication with the heatsink 704. In this configuration, the thermoelectric cells will radiate heat inward toward the cabin, while the heatsink 704 may be used to gather exterior heat or provide an additional surface for heat transfer onto the cool side of the cells. In such an embodiment, the thermoelectric cells may be mounted in a different location (e.g., below a platform 612) to allow heat to rise, thereby taking advantage of convective effects.

Figure 10:
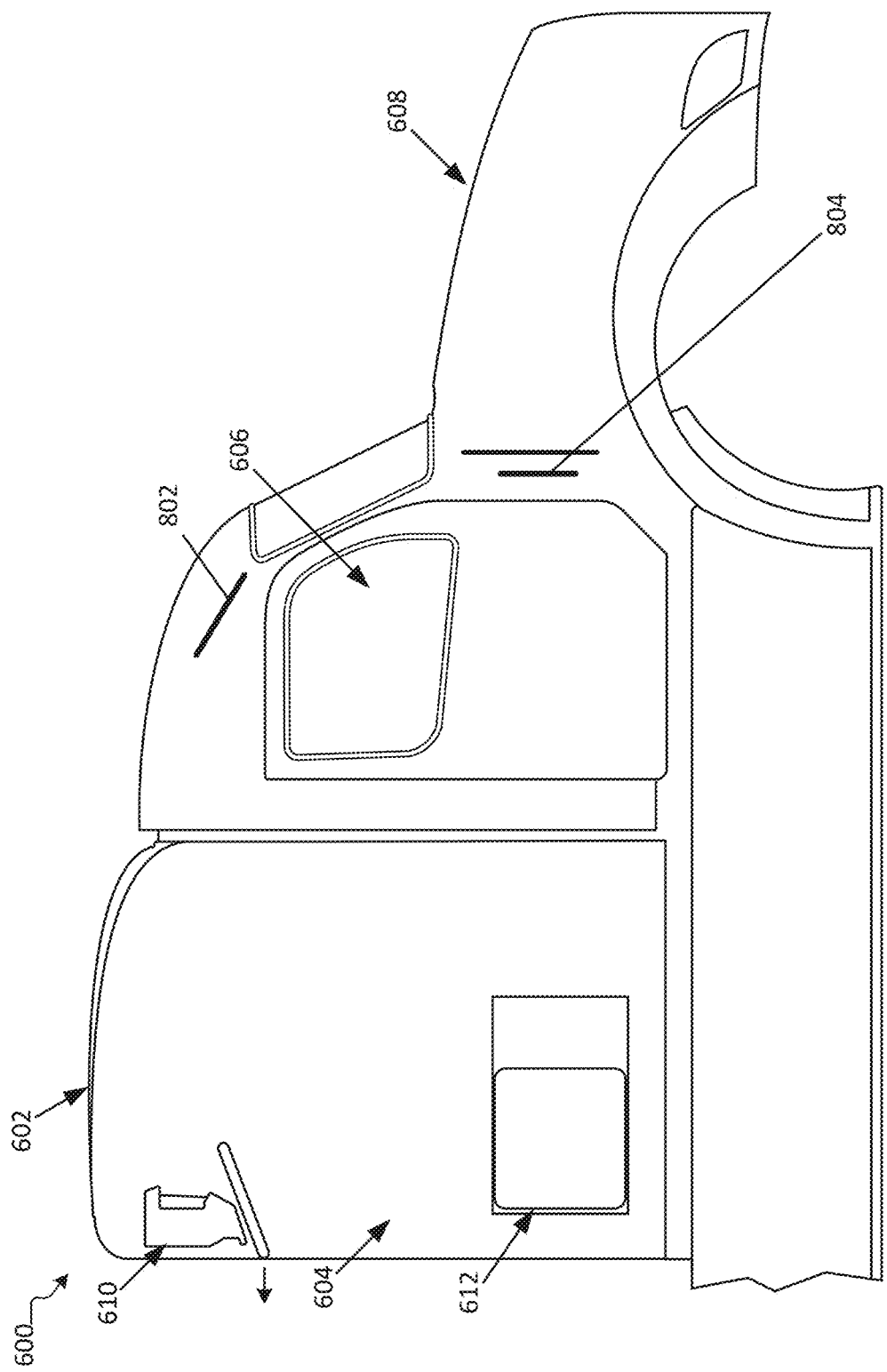
FIG. 10 is an example vehicle environment in which a thermoelectric cooling system may be implemented, according to a further embodiment.

In addition to the example location of thermoelectric cells 702 as described in conjunction with FIGS. 7-9, it is recognized that other locations and functions may be possible as well. For example, as seen in FIG. 10, an additional embodiment illustrates further thermoelectric cells 802, 804. A first set of thermoelectric cells 802 may be operatively connected to a control system as described above in conjunction with FIG. 2, and may be operable to provide heat or cooling within the front cabin 606. In the example shown, the thermoelectric cells 802 may provide cooling, as they are placed above a typical location of a vehicle operator. In alternate implementations where heat is desirable, the thermoelectric cells 802 may be used in an inverted orientation and placed elsewhere within the front cabin 606.

Additionally, thermoelectric cells 804 may be used to either provide heat within the front cabin 606, or to draw heat away from the engine compartment 608. In this way, the thermoelectric cells 804 may be mounted to a firewall of the vehicle separating the engine compartment 608 from the front cabin 606, and may be placed to either direct cooling toward the engine compartment 608, direct heat toward the front cabin 606, or some combination thereof.

Referring to FIGS. 7-10 generally, it is recognized that additional components may be used to assist with effective circulation of heat and or cooling within the front cabin 606 or rear cabin 604. For example, in some instances a fan, or more than one fan, may be used to assist with convective circulation. Still further, in some instances where cooling is desired, a drip tray may be placed below a portion of one or more of the thermoelectric cells 702, 802, 804 to collect any condensation that may gather on the thermoelectric cells during cooling.

Other embodiments of using the thermoelectric cooling system are contemplated. For example, a thermoelectric cooling system can be attached or otherwise installed in a seat to cool and/or heat the seat. Additionally, the thermoelectric cells of thermoelectric cooling system may experience a temperature difference due to a temperature difference between the first side and second side of the thermoelectric cells. The temperature difference generates power that can be supplied to a power supply to recharge the power supply. Also, the thermoelectric cooling system can be positioned to cool components in an environment such as in an engine compartment or a power supply location to prevent components from overheating.

This disclosure described some aspects of the present technology with reference to the accompanying drawings, in which only some of the possible embodiments were shown. Other aspects may, however, be embodied in many different forms and should not be construed as limited to the embodiments set forth herein. Rather, these aspects were provided so that this disclosure was thorough and complete and fully conveyed the scope of the possible embodiments to those skilled in the art.

The example embodiments described herein may be implemented using hardware, software, or a combination thereof and may be implemented in one or more computer systems or other processing systems. However, the manipulations performed by these example embodiments were often referred to in terms, such as entering, which are commonly associated with mental operations performed by a human operator. No such capability of a human operator is necessary, in any of the operations described herein. Rather, the operations may be completely implemented with machine operations. Useful machines for performing the operation of the example embodiments presented herein include general purpose digital computers or similar devices.

Although specific aspects were described herein, the scope of the technology is not limited to those specific embodiments. One skilled in the art will recognize other embodiments or improvements that are within the scope and spirit of the present technology. Therefore, the specific structure, acts, or media are disclosed only as illustrative embodiments. The scope of the technology is defined by the following claims and any equivalents therein.

What is claimed is:

1. A thermoelectric cooling system for a vehicle cabin, the thermoelectric cooling system comprising:
   a heatsink in thermal communication with an exterior of a vehicle cabin;
   one or more thermoelectric cells positioned within the vehicle cabin, each of the one or more thermoelectric cells having a first side and a second side, the second side mounted to the heatsink, wherein the one or more thermoelectric cells are electrically connected to a power supply, and, in response to receiving power from the power supply, the one or more thermoelectric cells are operable to produce a temperature difference between the first side and the second side, thereby drawing heat from the vehicle cabin to the heatsink; and a control unit operable to control the power received by the one or more thermoelectric cells by:
  determining a temperature difference between a desired temperature and a current temperature,
  if the temperature difference between the desired temperature and the current temperature indicates the desired temperature is lower than the current temperature, causing the one or more thermoelectric cells to receive power from the power supply, and
  if the temperature difference between the desired temperature and the current temperature indicates the desired temperature is higher than the current temperature, causing the one or more thermoelectric cells to receive no power from the power supply.

2. The thermoelectric cooling system of claim 1, further comprising a temperature system comprising:
  a temperature sensor operable to determine the current temperature in the vehicle cabin.

3. The thermoelectric cooling system of claim 1, wherein:
  the control unit comprises a voltage regulator; and
  the power received from the power supply comprises a voltage.

4. The thermoelectric cooling system of claim 3, wherein the voltage regulator is operable to determine a variation of the voltage of the power received by the one or more thermoelectric cells based on a magnitude of the temperature difference between the desired temperature and the current temperature.

5. The thermoelectric cooling system of claim 4, wherein, the temperature difference produced by the one or more thermoelectric cells varies linearly with the variation of the voltage of the power received by the one or more thermoelectric cells.

6. The thermoelectric cooling system of claim 1, wherein the power supply comprises a vehicle battery.

7. A method for cooling a vehicle cabin, the method comprising:
  determining a desired temperature of a vehicle cabin;
  determining a current temperature of the vehicle cabin;
  determining a temperature difference between the desired temperature and the current temperature;
  determining the temperature difference between the desired temperature and the current temperature indicates the desired temperature is lower than the current temperature; and
  in response to determining the temperature difference between the desired temperature and the current temperature indicates the desired temperature is lower than the current temperature, causing one or more thermoelectric cells to receive power from a power supply, wherein:
    the one or more thermoelectric cells have a first side and a second side, the second side mounted to a heatsink in thermal communication with an exterior of the vehicle cabin, and
    in response to receiving power, the one or more thermoelectric cells are operable to produce a temperature difference between the first side and the second side, thereby drawing heat from the vehicle cabin to the heatsink.

8. The method of claim 7, further comprising:
  determining a magnitude of the temperature difference between the desired temperature and the current temperature;
  determining a variation of the power based on the magnitude; and
  causing the one or more thermoelectric cells to receive the variation of the power from the power supply.

9. The method of claim 7, further comprising:
  determining the temperature difference between the desired temperature and the current temperature indicates the desired temperature is higher or equal to the current temperature; and
  causing the one or more thermoelectric cells to receive no power from the power supply.

10. The method of claim 7, further comprising:
  determining a magnitude of the temperature difference between the desired temperature and the current temperature;
  determining a fraction of a period to supply power to the one or more thermoelectric cells based on the magnitude; and
  causing the one or more thermoelectric cells to receive power from the power supply for the fraction of the period.

11. The method of claim 7, further comprising:
  determining a scheduled time when cooling should occur; and
  causing the one or more thermoelectric cells to receive power from the power supply when the scheduled time occurs.

12. A vehicle, comprising:
  a vehicle cabin;
  a power supply; and
  a thermoelectric cooling system, comprising:
    a heatsink in thermal communication with an exterior of the vehicle cabin;
    one or more thermoelectric cells positioned within the vehicle cabin, each of the one or more thermoelectric cells having a first side and a second side, the second side mounted to the heatsink, wherein, in response to receiving power from the power supply, the one or more thermoelectric cells are operable to produce a temperature difference between the first side and the second side, thereby drawing heat from the vehicle cabin to the heatsink; and
    a control unit operable to control the power received by the one or more thermoelectric cells by:
      determining a temperature difference between a desired temperature and a current temperature,
      if the temperature difference between the desired temperature and the current temperature indicates the desired temperature is lower than the current temperature, causing the one or more thermoelectric cells to receive power from the power supply, and
      if the temperature difference between the desired temperature and the current temperature indicates the desired temperature is higher than the current temperature, causing the one or more thermoelectric cells to receive no power from the power supply.

13. The vehicle of claim 12, wherein the thermoelectric cooling system is located above an operator position in the vehicle cabin.

14. The vehicle of claim 12, wherein the thermoelectric cooling system is located above a cooling area in the vehicle cabin.

15. The vehicle of claim 12, wherein the thermoelectric cooling system is located above a rear cabin of the vehicle cabin.

16. The vehicle of claim 12, wherein the vehicle is an electric vehicle.

17. The vehicle of claim 12, wherein the thermoelectric cooling system does not require use of a refrigerant cycle.

18. The vehicle of claim 12, further comprising a fan operable to spread air.

19. The vehicle of claim 12, wherein the control unit comprises a voltage regulator, and the power received from the power supply comprises a voltage.

20. The vehicle of claim 19, wherein the voltage regulator is operable to determine a variation of the voltage of the power received by the one or more thermoelectric cells based on a magnitude of the temperature difference between the desired temperature and the current temperature.

\* \* \* \* \*